US010192618B2

(12) United States Patent
Pyo et al.

(10) Patent No.: US 10,192,618 B2
(45) Date of Patent: Jan. 29, 2019

(54) NONVOLATILE MEMORY DEVICE AND OPERATING METHOD THEREOF

(71) Applicant: Samsung Electronics Co., Ltd., Suwon-si OT (KR)

(72) Inventors: Suk-Soo Pyo, Hwaseong-si (KR); Hyuntaek Jung, Seoul (KR); Taejoong Song, Seongnam-si (KR); Boyoung Seo, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/663,416

(22) Filed: Jul. 28, 2017

(65) Prior Publication Data

US 2018/0122467 A1 May 3, 2018

(30) Foreign Application Priority Data

Nov. 1, 2016 (KR) .................. 10-2016-0144664

(51) Int. Cl.
*G11C 13/00* (2006.01)

(52) U.S. Cl.
CPC ........ *G11C 13/0064* (2013.01); *G11C 13/004* (2013.01); *G11C 13/0026* (2013.01); *G11C 13/0028* (2013.01); *G11C 13/0069* (2013.01); *G11C 2013/0054* (2013.01)

(58) Field of Classification Search
CPC .................. G11C 11/1675; G11C 13/0069
USPC .................................. 365/148, 158
See application file for complete search history.

(56) References Cited

U.S. PATENT DOCUMENTS

| | | | | | |
|---|---|---|---|---|---|
| 5,293,345 | A | * | 3/1994 | Iwahashi | G11C 16/28 365/185.21 |
| 5,469,443 | A | * | 11/1995 | Saxena | G11C 29/10 714/719 |
| 5,545,933 | A | * | 8/1996 | Okamura | H02H 7/16 307/109 |
| 5,933,522 | A | * | 8/1999 | Sugimoto | G06T 7/0006 382/149 |
| 6,282,121 | B1 | * | 8/2001 | Cho | G11C 16/3454 365/185.22 |
| 7,116,598 | B2 | | 10/2006 | Shimizu et al. | |
| 7,679,133 | B2 | | 3/2010 | Son et al. | |
| 7,974,119 | B2 | | 7/2011 | Chen et al. | |
| 8,199,563 | B2 | | 6/2012 | Chen et al. | |
| 8,416,615 | B2 | | 4/2013 | Chen et al. | |
| 8,553,466 | B2 | | 10/2013 | Han et al. | |
| 8,559,235 | B2 | | 10/2013 | Yoon et al. | |
| 8,587,994 | B2 | | 11/2013 | Kim et al. | |
| 8,654,587 | B2 | | 2/2014 | Yoon et al. | |
| 8,681,573 | B2 | | 3/2014 | Hafez et al. | |

(Continued)

FOREIGN PATENT DOCUMENTS

JP 5316114 10/2013

*Primary Examiner* — Michael Tran
(74) *Attorney, Agent, or Firm* — Muir Patent Law, PLLC

(57) ABSTRACT

An operating method of a nonvolatile memory device includes storing different data in first and second reference cells connected to a word line, checking whether the different data are abnormally stored in the first and second reference cells, and when it is determined that the different data are abnormally stored in the first and second reference cells, swapping the first and second reference cells.

18 Claims, 15 Drawing Sheets

(56) References Cited

U.S. PATENT DOCUMENTS

| | | |
|---|---|---|
| 8,787,098 B2 | 7/2014 | Kim et al. |
| 9,030,865 B2 | 3/2015 | Chow et al. |
| 9,147,695 B2 | 9/2015 | Hasbani et al. |
| 9,171,888 B2 | 10/2015 | Quinsat et al. |
| 9,251,881 B2 | 2/2016 | Kim et al. |
| 9,257,984 B2 | 2/2016 | Singh et al. |
| 9,274,721 B2 | 3/2016 | Oh et al. |
| 9,324,404 B2 | 4/2016 | Rao et al. |
| 9,390,786 B2 | 7/2016 | Lecocq et al. |
| 2002/0041242 A1* | 4/2002 | Takahashi ............ G11C 29/26 341/120 |
| 2002/0191469 A1* | 12/2002 | Honma ............ G11C 5/14 365/226 |
| 2005/0249006 A1* | 11/2005 | Tran ............ G11C 7/062 365/207 |
| 2006/0239073 A1* | 10/2006 | Toda ............ G11C 11/5642 365/185.03 |
| 2008/0198648 A1* | 8/2008 | Lee ............ G11C 11/16 365/171 |
| 2009/0059647 A1* | 3/2009 | Hoya ............ G06F 11/1008 365/145 |
| 2009/0228739 A1* | 9/2009 | Cohen ............ G06F 11/1072 714/6.12 |
| 2009/0240871 A1* | 9/2009 | Yano ............ G06F 12/0246 711/103 |
| 2010/0195374 A1* | 8/2010 | Rennie ............ G11C 11/412 365/156 |
| 2011/0102019 A1 | 5/2011 | Osada et al. |
| 2011/0185245 A1* | 7/2011 | Miller ............ G11C 11/4125 714/746 |
| 2011/0233648 A1 | 9/2011 | Seol et al. |
| 2013/0028010 A1 | 1/2013 | Li et al. |
| 2013/0301335 A1* | 11/2013 | Ong ............ G11C 29/06 365/148 |
| 2014/0010003 A1* | 1/2014 | Zhou ............ G11C 11/165 365/158 |
| 2014/0071739 A1 | 3/2014 | Kim et al. |
| 2014/0281725 A1* | 9/2014 | Karidis ............ G06F 11/0751 714/37 |
| 2016/0019943 A1 | 1/2016 | Chih et al. |
| 2016/0078924 A1 | 3/2016 | Thomas et al. |
| 2016/0148695 A1* | 5/2016 | Kim ............ G11C 16/12 365/185.03 |

* cited by examiner

NONVOLATILE MEMORY DEVICE AND OPERATING METHOD THEREOF

CROSS-REFERENCE TO RELATED APPLICATION(S)

This U.S. non-provisional patent application claims priority under 35 U.S.C. § 119 to Korean Patent Application No. 10-2016-0144664 filed Nov. 1, 2016, in the Korean Intellectual Property Office, the entire contents of which are hereby incorporated by reference.

BACKGROUND

Exemplary embodiments relate to a nonvolatile memory device and an operating method thereof, and more particularly, to a nonvolatile memory device including a magnetic memory element and an operating method thereof.

In high-speed and/or low-power electronic devices, the demand for a high speed and a low operating voltage of a semiconductor memory device included therein is increasing. To satisfy the demand, a magnetic memory element was suggested as a semiconductor memory element. Since the magnetic memory element has a high-speed operation and/or a nonvolatile characteristic, the magnetic memory element is in the spotlight as a next-generation semiconductor memory element.

In general, the magnetic memory element may include a magnetic tunnel junction (MTJ). The MTJ may include two magnetic materials and an insulating layer interposed therebetween. A resistance value of the MTJ may vary with magnetization directions of the two magnetic materials. For example, the MJT may have a large resistance value when the magnetization directions of the two magnetic materials are oppositional or anti-parallel to each other and may have a low resistance value when the magnetization directions of the two magnetic materials are parallel to each other. It may be possible to write or read data by using a difference between the resistance values.

SUMMARY

Some exemplary embodiments provide a nonvolatile memory device with improved reliability and an operating method thereof. Also, some exemplary embodiments provide a nonvolatile memory device that makes it possible to reduce a chip size.

According to an aspect of an embodiment, an operating method of a nonvolatile memory device including a memory cell array includes storing different data in first and second reference cells of the memory cell array connected to a word line, checking whether the different data are abnormally stored in the first and second reference cells, and when it is determined that the different data are not stored in the first and second reference cells, swapping the first and second reference cells.

According to another aspect of an embodiment, an operating method of a nonvolatile memory device includes first storing a first data in a first reference cell and a second data opposite to the first data in a second reference cell, the first reference cell connected to a word line and the second reference cell connected to the word line, determining whether the first and second data are abnormally stored in the first and second reference cells after the first storing is performed, and when it is determined that the first and second data are abnormally stored in the first and second reference cells, second storing the second data in the first reference cell and the first data in the second reference cell.

According to another aspect of an embodiment, a nonvolatile memory device includes a first memory cell connected to a first bit line, a first reference cell connected to a first reference bit line, a second reference cell connected to a second reference bit line, and a sense amplifier configured to compare a voltage of the first bit line with a reference voltage. The reference voltage is a voltage of a node at which the first reference bit line and the second reference bit line are connected to each other. The nonvolatile memory device is configured to perform a reference cell setting operation such that a first data and a second data opposite to the first data are respectively written in the first reference cell and the second reference cell. When it is determined that the first data and the second data are abnormally written in the first reference cell and the second reference cell, the second data and the first data are respectively written in the first reference cell and the second reference cell.

According to another aspect of an embodiment, a nonvolatile memory device includes at least one memory cell array comprising a plurality of memory cells connected between word lines and bit lines, at least one reference cell array comprising first and second reference cells connected between the word lines and reference bit lines, a bit line selection circuit connected to the bit lines and the reference bit lines, and a sense amplifier connected to a bit line of the bit lines or at least one reference bit line that is selected by the bit line selection circuit. The nonvolatile memory device is configured to perform a reference cell setting operation such that a first data and a second data opposite to the first data are respectively written in the first and second reference cells. When it is determined that data stored in the first and second reference cells are abnormally stored, the second data and the first data are respectively written in the first and second reference cells.

According to another aspect of an embodiment, a nonvolatile memory device includes a plurality of word lines and bit lines, and a plurality of memory cells connected to the plurality of word lines and bit lines. Each of the plurality of memory cells includes a variable resistance element connected to a bit line of the plurality of bit lines, and a transmission gate connected between the variable resistance element and a source line. The transmission gate includes a first insulating layer formed on a well connected to a ground voltage, an n-channel metal oxide semiconductor field effect transistor (n-MOSFET) formed on the first insulating layer, a second insulating layer formed on the well, the second insulating layer being in the same layer as the first insulating layer, and a p-channel metal oxide semiconductor field effect transistor (p-MOSFET) formed on the second insulating layer.

According to another aspect of an embodiment, a storage device includes at least one nonvolatile memory device, and a memory controller configured to control the at least one nonvolatile memory device. The at least one nonvolatile memory device comprises a plurality of memory cells. Each of the memory cells comprises a variable resistance element and a transmission gate connected in series between a bit line and a source line. The transmission gate is configured to turn on by a voltage applied to a word line. The transmission gate includes a first insulating layer formed on a well connected to a ground voltage, an n-channel metal oxide semiconductor (NMOS) transistor formed on the first insulating layer, a second insulating layer formed on the well, and a p-channel metal oxide semiconductor (PMOS) transistor formed on the second insulating layer, and a ground voltage is applied to the well.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Various exemplary embodiments will be described in detail and clearly with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

Figure 1:
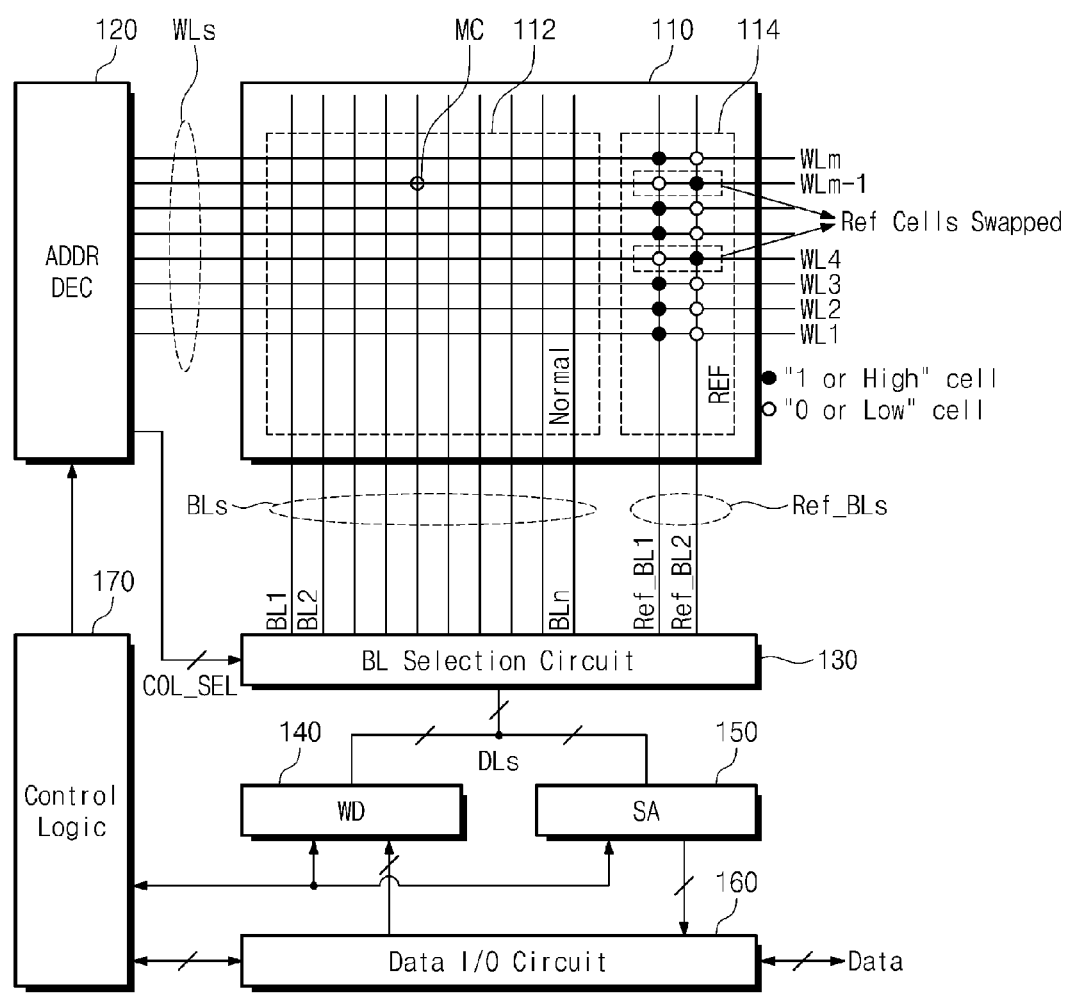
FIG. 1 is a drawing illustrating a nonvolatile memory device, according to example embodiments.

FIG. 1 is a drawing illustrating a nonvolatile memory device, according to example embodiments. Referring to FIG. 1, a nonvolatile memory device 100 may include a memory cell array 110, an address decoder 120, a bit line selection circuit 130, a write driver circuit 140, a sense amplifier circuit 150, a data input/output circuit 160, and a control logic circuit 170.

The memory cell array 110 may include a plurality of memory cells for storing data. For example, the memory cell array 110 may include memory cells each of which is a resistive memory cell, such as a phase change random access memory (PRAM) cell or a resistance RAM (RRAM) cell, a nano floating gate memory (NFGM) cell, a polymer RAM (PoRAM) cell, a magnetic RAM (MRAM) cell, a ferroelectric RAM (FRAM) cell. In particular, the memory cell array 110 may include spin transfer torque magneto resistive RAM (STT-MRAM) cells. For example, each memory cell may include an MTJ cell having a magnetic material. For ease of description, below, it is assumed that each memory cell is the MTJ cell.

The memory cell array 110 may include at least one normal cell array 112 and at least one reference cell array 114.

The normal cell array 112 may include a plurality of memory cells at intersections of a plurality of word lines WL1 to WLm (m being an integer of 2 or more) and a plurality of bit lines BL1 to BLn (n being an integer of 2 or more).

The reference cell array 114 may include a plurality of reference cells at intersections of the word lines WL1 to WLm and first and second reference cell bit lines Ref_BL1 and Ref_BL2. Meanwhile, it should be understood that the number of reference cell bit lines connected to one word line is not limited to "2".

For example, as illustrated in FIG. 1, a first reference cell RC1 and a second reference cell RC2 may be connected to each of the word lines WL1 to WLm. Here, the first reference cell RC1 may be connected to the first reference cell bit line Ref_BL1, and the second reference cell RC2 may be connected to the second reference cell bit line Ref_BL2.

In an embodiment, the first and second reference cells RC1 and RC2 connected to each of the word lines WL1 to WLm may store different pieces of data. For example, the first reference cell RC1 may store data "1" (or may have a high resistance) and the second reference cell RC2 may store data "0" (or may have a low resistance), and vice versa.

In particular, according to an embodiment, in the process of setting reference cells, data of the first reference cell RC1 and data of the second reference cell RC2 may be swapped for each other. For example, a write operation for storing data "1" in each of the first reference cells RC1 connected to the first reference cell bit line Ref_BL1 and data "0" in each of the second reference cells RC2 connected to the second reference cell bit line Ref_BL2 may be performed in a reference cell setting operation (e.g., a first reference cell setting operation).

However, as illustrated in FIG. 1, write fail may occur in the first reference cells RC1 and the second reference cells RC2 connected to the specific word lines WL4 and WLm−1 after the first reference cell setting operation is performed. For example, not data "1" but data "0" may be written in the first reference cells RC1 of the word lines WL4 and WLm−1, and not data "0" but data "1" may be written in the second reference cells RC2 of the word lines WL4 and WLm−1. In the case of the MTJ cell, if a write characteristic of one direction becomes worse, a write characteristic of the other direction becomes better. A write operation for storing data "0" in the first reference cells RC1 connected to the specific word lines WL4 and WLm−1, in which the write fail has occurred, and data "1" in the second reference cells RC2 connected thereto may be performed in consideration of the above-described characteristic. According to an embodiment, when the write fail has occurred in the first reference cell setting process, target data of the reference cells RC1 and RC2 may be swapped for each other by a second reference cell setting operation. The target data refers to a data value (e.g., "1" or "0") of the reference cells RC1 and RC2 to be written in the first reference cell setting operation.

For example, in the first reference cell setting operation, the first reference cells RC1 of the word lines WL1 to WLm may store data "1," and the second reference cells RC2 of the word lines WL1 to WLm may store data "0." When the write fail has occurred, in the second reference cell setting operation, the first reference cells RC1 of the WL4 and WLm−1 may store data "0," and the second reference cells RC2 of the word lines WL4 and WLm−1 may store data "1." The second reference cell setting operation may be referred to as a swapping operation.

The address decoder 120 may decode an input address ADDR to a row address and a column address. The address decoder 120 may select one word line of the plurality of word lines WL1 to WLm based on the row address. Also, the address decoder 120 may transmit a column selection signal COL_SEL to the bit line selection circuit 130 based on the column address.

The bit line selection circuit 130 may connect data lines DLs to selected one or more bit lines and the reference cell bit lines Ref_BLs in response to the column address. In an embodiment, the address decoder 120 may include components such as a row decoder, a column decoder, and an address buffer.

The bit line selection circuit 130 may be connected to the memory cell array 110 through the bit lines BLs and/or the reference cell bit lines Ref_BLs and may be connected to the write driver circuit 140 and the sense amplifier circuit 150 through the data lines DLs. The bit line selection circuit 130 may operate under control of the control logic circuit 170. The bit line selection circuit 130 may be configured to receive the column selection signal COL_SEL decoded by the address decoder 120.

Also, the bit line selection circuit 130 may select one or more bit lines of the bit lines BLs and/or the reference cell bit lines Ref_BLs, based on the column selection signal COL_SEL. For example, during a write operation, the bit line selection circuit 130 may connect the selected bit lines and/or the reference cell bit lines Ref_BLs to the data lines DLs for connection with the write driver circuit 140. During a read operation, the bit line selection circuit 130 may connect the selected bit lines and/or the reference cell bit lines Ref_BLs to the sense amplifier circuit 150.

The write driver circuit 140 may operate under control of the control logic circuit 170. The write driver circuit 140 may be configured to program memory cells that are connected to bit lines and/or reference cell bit lines selected by the bit line selection circuit 130 and a word line selected by the address decoder 120. The write driver circuit 140 may generate a current or a voltage based on data from the data input/output circuit 160 and may output the current or the voltage to the selected bit lines BLs and/or the selected reference cell bit lines Ref_BLs.

The sense amplifier circuit 150 may operate under control of the control logic circuit 170. The sense amplifier circuit 150 may include a plurality of sense amplifiers that read data from memory cells that are connected to bit lines and/or reference cell bit lines selected by the bit line selection circuit 130 and a word line selected by the address decoder 120. The sense amplifiers may read data from memory cells by sensing currents flowing through the selected bit lines BLs and/or the selected reference bit lines Ref_BLs and/or voltages applied thereto. The sense amplifier circuit 150 may output read data to the data input/output circuit 160.

The data input/output circuit 160 may operate under control of the control logic circuit 170. The data input/output circuit 160 may transmit data input from an outside of the nonvolatile memory device 100 to the write driver circuit 140 and may output data input from the sense amplifier circuit 150 to the outside.

The control logic circuit 170 may control overall operations of the nonvolatile memory device 100. The control logic circuit 170 may operate in response to a command or control signals transmitted from the outside.

According to an embodiment, the nonvolatile memory device 100 may swap data based on reference cell characteristics upon the first setting reference cells, thereby improving read reliability.

Figure 2:
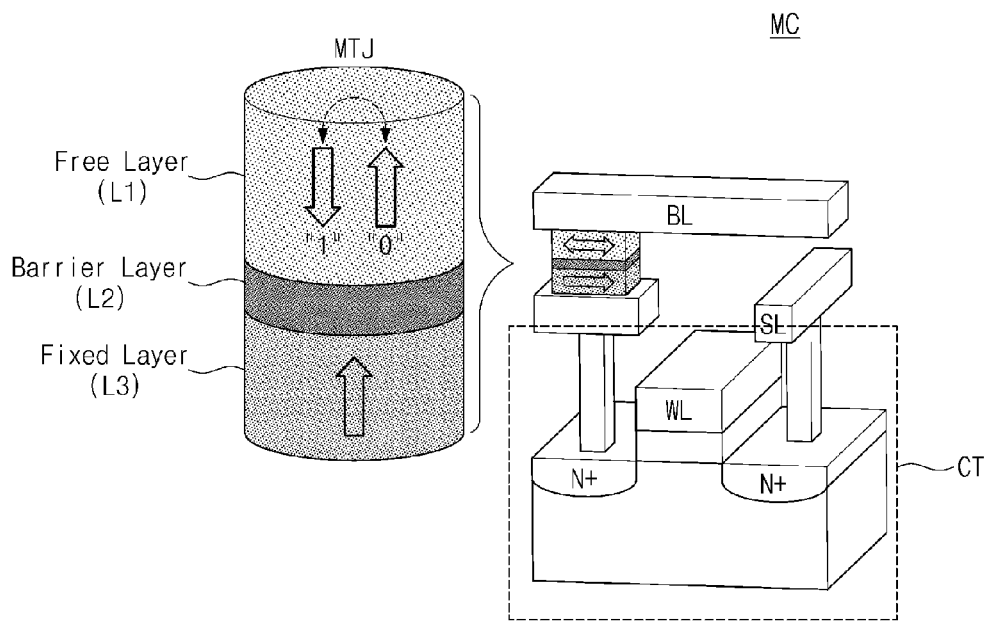
FIG. 2 is a drawing illustrating a memory cell in FIG. 1, according to example embodiments.

FIG. 2 is a drawing illustrating a memory device, according to example embodiments. Referring to FIG. 2, a memory cell may be one of a memory cell and a reference cell. The memory cell MC may include a variable resistance element MTJ and a cell transistor CT. A gate of the cell transistor CT may be connected to a word line WL. One electrode (i.e., source/drain) of the cell transistor CT may be connected to a bit line BL through the variable resistance element MTJ. Also, the other electrode (i.e., source/drain) of the cell transistor CT may be connected to a source line SL.

The variable resistance element MTJ may include a free layer L1, a fixed layer L3, and a barrier layer L2 positioned therebetween. A magnetization direction of the fixed layer L3 may be fixed, and a magnetization direction of the free layer L1 may be the same as or opposite to the magnetization direction of the fixed layer L3 under a condition. To fix the magnetization direction of the fixed layer L3, the variable resistance element MTJ may further include an anti-ferromagnetic layer (not illustrated).

In an embodiment, the free layer L1 may include a material that has a variable magnetization direction. The magnetization direction of the free layer L1 may be changed by an electrical/magnetic factor provided from the outside and/or inside of the memory cell. The free layer L1 may include a ferromagnetic material that contains at least one of cobalt (Co), iron (Fe), and nickel (Ni). For example, the free layer L1 may include at least one selected from FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, Y3Fe5O12, etc.

In an embodiment, the barrier layer L2 may have a thickness that is smaller than a spin diffusion distance. The barrier layer L2 may include a nonmagnetic material. For example, the barrier layer L2 may include at least one selected from magnesium (Mg), titanium (Ti), aluminum (Al), magnesium-zinc (Mg—Zn) oxide, and nitride of titanium (Ti) and vanadium (V).

In an embodiment, the fixed layer L3 may have a magnetization direction fixed by the anti-ferromagnetic layer. Also, the fixed layer L3 may include a ferromagnetic material. For example, the fixed layer L3 may include at least one selected from CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO, Y3Fe5O12, etc.

In an embodiment, the anti-ferromagnetic layer may include an anti-ferromagnetic material. For example, the anti-ferromagnetic layer may include at least one selected from PtMn, IrMn, MnO, MnS, MnTe, MnF2, FeCl2, FeO, CoCl2, CoO, NiCl2, NiO, Cr, etc.

A voltage of logical high may be provided to the word line WL upon performing a read operation on the memory cell MC. The cell transistor CT may be turned on in response to the voltage of the word line WL. Also, to measure a resistance value of the variable resistance element MTJ, a read current may be provided in a direction from the bit line BL to the source line SL. Data that are stored in the variable resistance element MTJ may be determined based on the measured resistance value.

In an embodiment, an extending direction of the word line WL may be the same as an extending direction of the source line SL. However, it should be understood that the extending direction of the word line WL and the extending direction of the source line SL are not limited thereto.

In an embodiment, an extending direction of the word line WL and an extending direction of the source line SL may be perpendicular to each other.

For example, a resistance value of the variable resistance element MTJ may change with the magnetization direction of the free layer L1. When a read current is provided to the variable resistance element MTJ, a data voltage corresponding to a resistance value of the variable resistance element MTJ is output. Since the intensity of the read current is much smaller than the intensity of a write current, in general, the magnetization direction of the free layer L1 may not change by the read current.

In an embodiment, in the variable resistance element MTJ, a magnetization direction of the free layer L1 and a magnetization direction of the fixed layer L3 are arranged parallel to each other. Accordingly, the variable resistance element MTJ has a small resistance value. In this case, data may be determined, for example, as "0". In an example embodiment, data may be determined, for example, as "1".

In an embodiment, in the variable resistance element MTJ, a magnetization direction of the free layer L1 and a magnetization direction of the fixed layer L3 are arranged anti-parallel to each other. Accordingly, the variable resistance element MTJ has a large resistance value. In this case, data may be determined, for example, as "1". In an example embodiment, data may be determined, for example, as "0".

For example, in FIG. 2, an embodiment is illustrated as the free layer L1 and the fixed layer L3 of the variable resistance element MTJ are provided by using a horizontal magnetic element. However, embodiments of the inventive concept may not be limited thereto. As another example, the free layer L1 and the fixed layer L3 of the variable resistance element MTJ may be provided by using with a vertical magnetic element.

Figure 3:
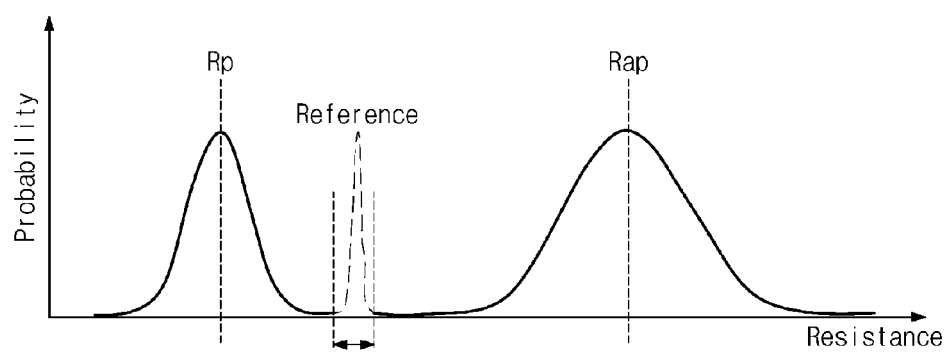
FIG. 3 is a drawing illustrating a method of setting a reference value of a memory cell, according to example embodiments.

FIG. 3 is a drawing illustrating a method of setting a reference resistance value of a memory cell, according to example embodiments. Referring to FIG. 3, a reference resistance value for determining data "1" and data "0" may be determined between a first resistance value Rp (e.g., low resistance state) and a second resistance value Rap (e.g., high resistance state). Here, the first resistance value Rp is a resistance value of a memory cell when in the variable resistance element MTJ, a magnetization direction of the free layer L1 and a magnetization direction of the fixed layer L3 are parallel to each other, and the second resistance value Rap is a resistance value of the memory cell when in the variable resistance element MTJ, the magnetization direction of the free layer L1 and the magnetization direction of the fixed layer L3 are anti-parallel to each other.

Figure 4:
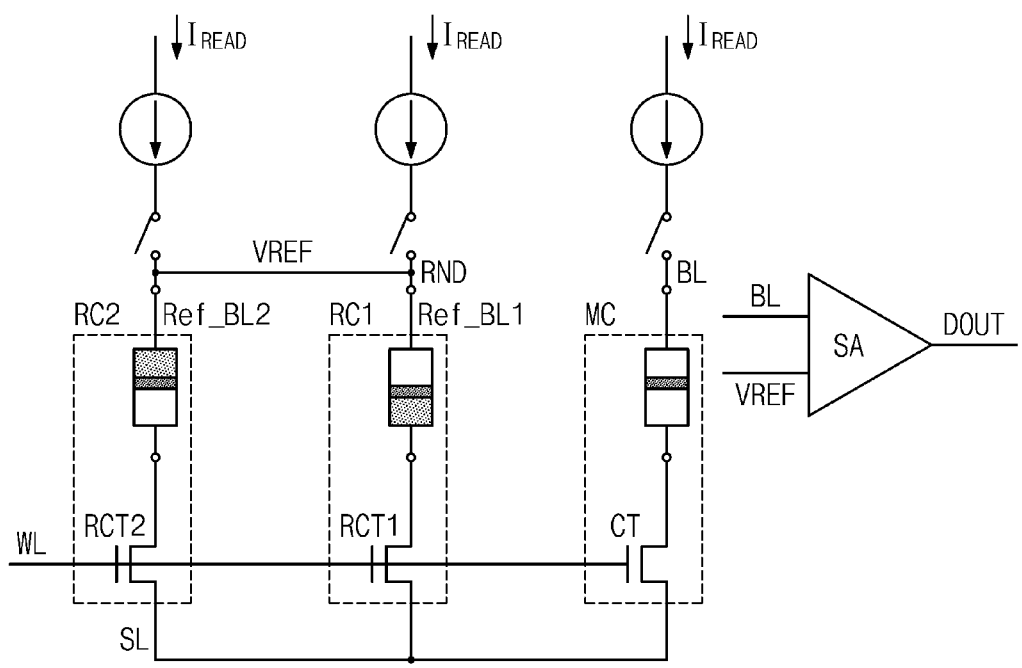
FIG. 4 is a drawing illustrating a process of reading data of a memory cell, according to example embodiments.

FIG. 4 is a drawing illustrating a process of reading data of a memory cell MC, according to example embodiments. Referring to FIG. 4, when the same read current $I_{READ}$ flows to a memory cell MC connected to a bit line BL and the first and second reference cells RC1 and RC2, respectively connected to the reference bit lines Ref_BL1 and Ref_BL2, the sense amplifier SA may determine whether data DOUT of the memory cell MC is "0" or "1", by comparing a voltage of the bit line BL connected to the memory cell MC with a reference voltage VREF. Here, the reference voltage VREF may be a voltage of a node RND to which the first and second reference cell bit lines Ref_BL1 and Ref_BL2 are connected and may be determined by voltage division of the first resistance value Rp and the second resistance value Rap that are connected in parallel to each other.

In an embodiment, during a read operation, cell transistors RCT1, RCT2, and CT connected to a word line WL may be turned on at the same time. Here, the cell transistors RCT1, RCT2, and CT may be connected in common to the source line SL.

As illustrated in FIG. 4, if the first and second resistance values Rp and Rap that correspond to different pieces of data are respectively set to the first and second reference cells RC1 and RC2, the reference voltage VREF for determining data of the memory cell MC may be generated normally.

Figure 5:
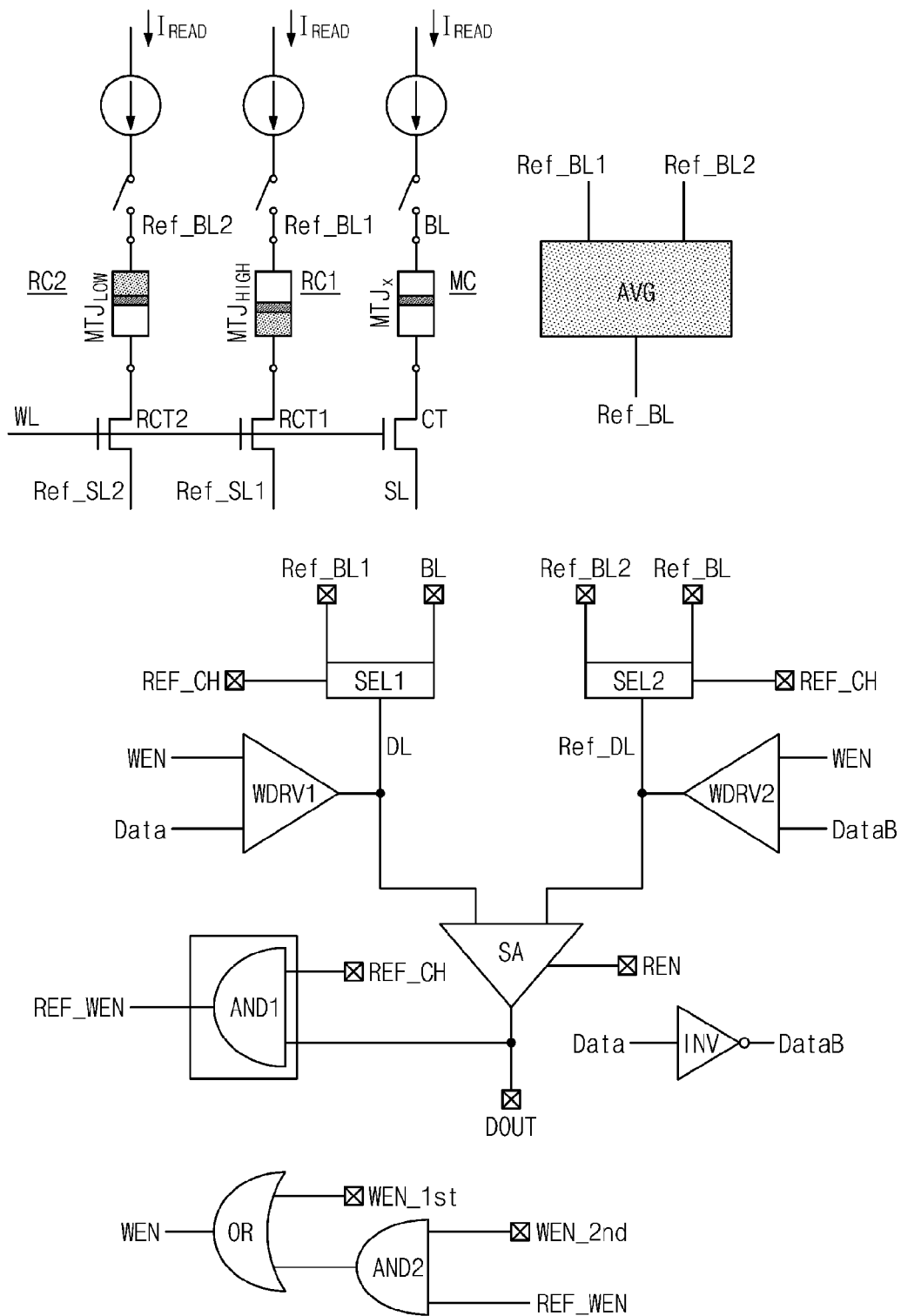
FIG. 5 is a drawing illustrating a data path for performing a reference cell swap function, according to example embodiments.

FIG. 5 is a drawing illustrating a data path for performing a reference cell swap function, according to example embodiments.

Referring to FIG. 5, in a normal read operation, a reference cell bit line Ref_BL may be implemented by an average circuit AVG to output the reference voltage VREF such that the first reference cell bit line Ref_BL1 and the second reference cell bit line Ref_BL2 are connected to each other. In the normal read operation, a bit line BL and the reference cell bit line Ref_BL may be connected to the sense amplifier SA, and the sense amplifier SA may output a comparison result value to an output node DOUT in response to a read enable signal REN. The reference cell transistor RCT1 of a first reference cell RC1 may be connected to a first reference source line Ref_SL1, the reference cell transistor RCT2 of a second reference cell RC2 may be connected to a second reference source line Ref_SL2, and the cell transistor CT of a memory cell MC may be connected to a source line SL. In an example embodiment, the first and second reference source lines Ref_SL1 and Ref_SL2, and the source line SL may be connected in common. A gate terminal of each of the reference cell transistors RCT1 and RCT2, and the cell transistor CT may be connected to a word line.

Also, in a reference cell setting operation, the first reference cell bit line Ref_BL1 and the second reference cell bit line Ref_BL2 may be connected to the sense amplifier SA in response to a reference cell channel signal REF_CH. As an example, when the reference cell channel signal REF_CH is a high level "H", the first reference cell bit line Ref_BL1 may be connected to a data line DL by a first selection circuit SEL1, and the second reference cell bit line Ref_BL2 may be connected to a reference data line Ref_DL by a second selection circuit SEL2. As another example, when the reference cell channel signal REF_CH is a low level "L", the first selection circuit may connect the bit line Ref_BL1 to the data line DL, and a second selection circuit may connect the second reference cell bit line Ref_BL2 to the reference data line Ref_DL.

In an embodiment, in the reference cell setting operation, each of the first write driver WDRV1 and the second write driver WDRV2 may output values that are obtained based on data Data and an inversion of the data DataB, respectively when a write enable signal WEN is enabled, and the output values may be input to the reference cells RC1 and RC2. Here, an inverter INV may output data DataB that are obtained by inverting data Data.

In an embodiment, an AND gate AND1 may generate a reference cell write signal REF_WEN by performing an AND operation on the reference cell channel signal REF_CH and an output DOUT of the sense amplifier SA.

In an embodiment, an AND gate AND2 may perform an AND operation on a second reference cell enable signal WEN_2nd and the reference cell write signal REF_WEN, and an OR gate OR may generate the write enable signal WEN by performing an OR operation on a first reference cell write enable signal WEN_1st and an output value of the AND gate AND2.

Figure 9:
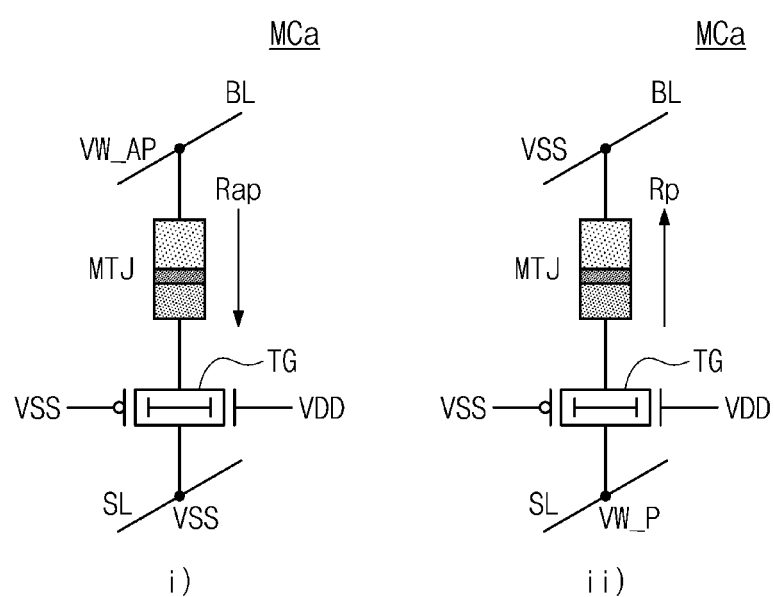
FIG. 9 is a drawing illustrating a memory cell, according to other example embodiments.

In example embodiments, each of the reference cell transistors RCT1 and RCT2, and cell transistor CT may be implemented by a transmission gate TG having a p-channel metal oxide semiconductor (PMOS) transistor and an n-channel metal oxide semiconductor (NMOS) transistor as shown in FIG. 9. In this case, each gate terminal of the PMOS and NMOS transistors may be controlled by a word line enable signal.

As illustrated in FIG. 5, according to an embodiment of the inventive concept, the volatile memory device 100 may include different data paths for the normal read operation and the reference cell setting operation.

Figure 6:
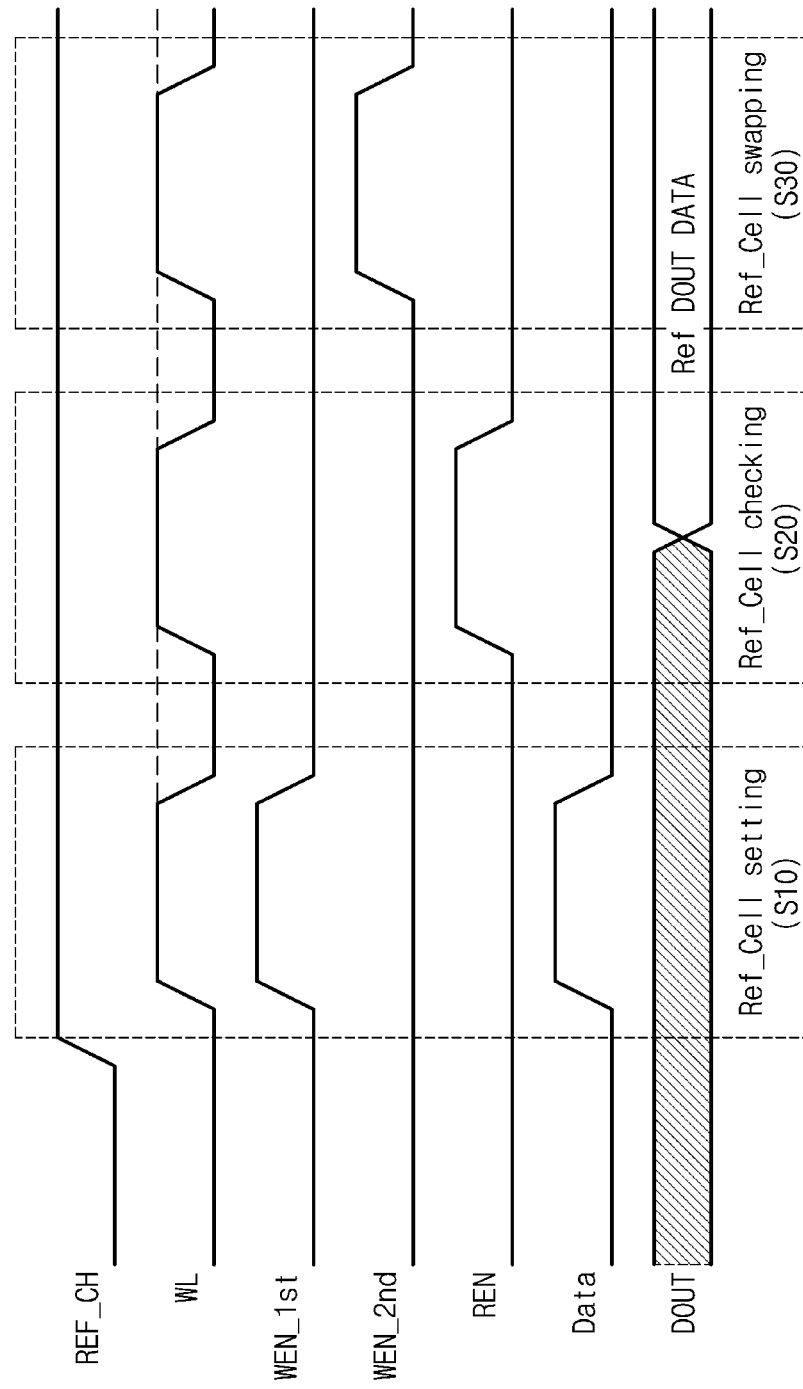
FIG. 6 is a timing diagram for describing a reference cell setting operation, according to example embodiments.

FIG. 6 is a timing diagram for describing a reference cell setting operation, according to example embodiments. Referring to FIGS. 5 and 6, a reference cell setting operation may include an operation of setting reference cells (S10), an operation of checking the reference cells (S20), and an operation of swapping the reference cells (S30).

For the reference cell setting operation, first, the reference cell channel signal REF_CH may have a high level.

In the reference cell setting operation (S10), a word line WL has a high level, the first reference cell write enable signal WEN_1st has a high level, and the second reference cell enable signal WEN_2nd has a low level.

As an example, Data of a high level may be input to the first write driver WDRV1. The first write driver WDRV1 may output a high level "H" in response to the write enable signal WEN. The first selection circuit SEL1 may provide the high level "H" to store a first data (e.g, "H") in the first reference cell RC1 by connecting the first reference bit line Ref_BL1 with the data line DL in response to the channel signal REF_CH. The second write driver WDRV2 may output a low level "L" in response to the write enable signal WEN. The second selection circuit SEL2 may provide the low level "L" to store a second data (e.g., "L") in the second reference cell RC2 by connecting the second reference bit line Ref_BL2 to the reference data line Ref_DL in response to the channel signal REF_CH.

As another example, Data of a low level may be input to the first write driver WDRV1. The first write driver WDRV1 may output the low level "L" in response to the write enable signal WEN. The first selection circuit SEL1 may provide the low level "L" to store the second data (e.g., "L") in the first reference cell RC1 by connecting the first reference bit line Ref_BL1 to the data line DL in response to the channel signal REF_CH. The second write driver WDRV2 may output the high level "H" in response to the write enable signal WEN. The second selection circuit SEL2 may provide the high level "H" to store the first data (e.g., "H") in the second reference cell RC2 by connecting the second reference bit line Ref_BL2 to the reference data line Ref_DL in response to the channel signal REF_CH.

In example embodiments, the reference cell setting operation (S10) may be referred to as a first reference cell setting operation or a first storing operation of reference cells.

Afterwards, in the reference cell checking operation (S20), the word line WL may have or maintain the high level, the first and second reference cell write enable signals WEN_1st and WEN_2nd may have the low level, and the read enable signal REN may have the high level. As such, data that are stored in the reference cells RC1 and RC2 after the first reference cell setting operation is performed may be output from the output node DOUT of the sense amplifier SA when the read enable signal REN has the high level. For example, the sense amplifier SA may output the specific data (e.g., "H") when a level difference between the first reference cell RC1 and the second reference cell RC2 is not enough or data of the reference cells RC1 and RC2 are abnormally stored during the first reference cell setting operation.

In example embodiments, the reference cell checking operation (S20) may be referred to as a reference cell read operation.

In the reference cell read operation, when the specific data (e.g., "H") is output from the output node DOUT, the process proceeds to the reference cell swapping operation (S30). In the reference cell swapping operation (S30), the word line WL maintains or has the high level during a predetermined time, the first reference cell write enable signal WEN_1st has the low level, and the second reference cell write enable signal WEN_2nd has the high level. Here, the second reference cell write enable signal WEN_2nd may be a reference cell swapping enable signal.

As an example, when the sense amplifier SA outputs the specific data (e.g., a high level "H") after the first reference cell setting operation which Data of a high level is to be stored in the first reference cell RC1, Data of a low level may be input to the first write driver WDRV1.

In contrast, in the reference cell read operation, when the specific data are not output (e.g., a low level "L"), the reference cell swapping operation (S30) may not be performed.

In example embodiments, the reference cell swapping operation (S30) may be referred to as a second reference cell setting operation or a second storing operation of reference cells.

As an example, the first reference cell setting operation may be performed before shipping the nonvolatile memory device 100. However, embodiments of the inventive concept may not be limited thereto. According to an embodiment, the first reference cell setting operation may be performed anytime during an initialization operation or an operation of the nonvolatile memory device 100.

As an example, the memory cell array 110 of the nonvolatile memory device 100 illustrated in FIG. 1 includes one normal cell array 112 and one reference cell array 114. However, embodiments of the inventive concept may not be limited thereto. For example, the memory cell array 110 may be implemented with a plurality of normal cell arrays and a plurality of reference cell arrays.

Figure 7:
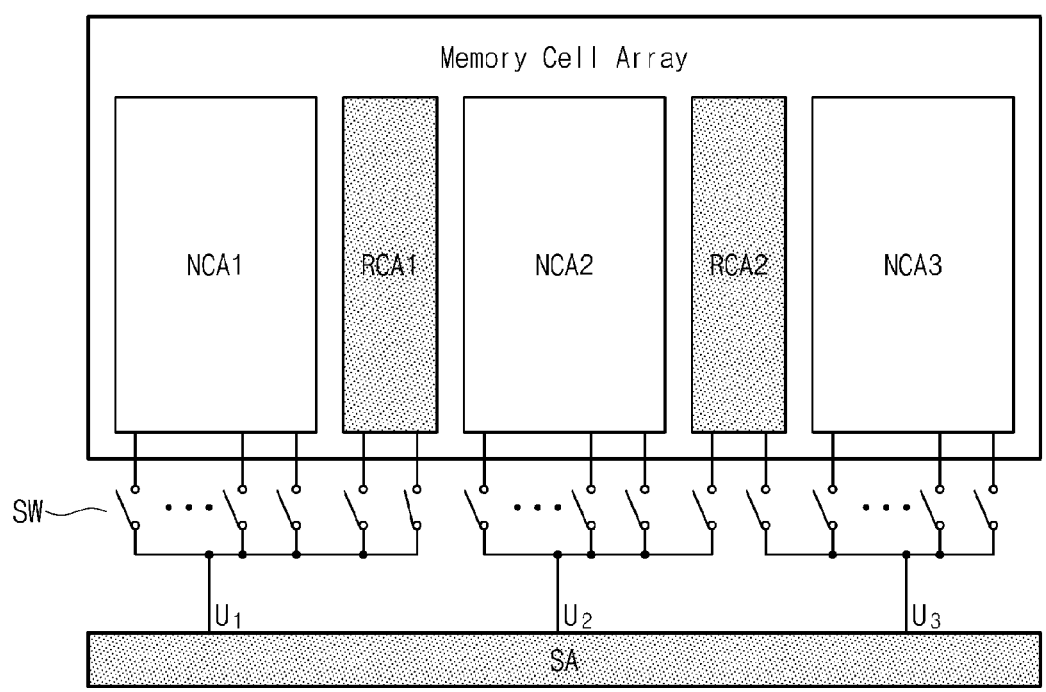
FIG. 7 is a drawing illustrating a nonvolatile memory device, according to example embodiments.

FIG. 7 is a drawing illustrating a nonvolatile memory device 100a, according to example embodiments. Referring to FIG. 7, the nonvolatile memory device 100a may include three normal cell arrays NCA1, NCA2, and NCA3, two reference cell arrays RCA1 and RCA2, a switch circuit SW, and one corresponding sense amplifier SA. The switch circuit SW may include the bit line selection circuit 130 of FIG. 1. The sense amplifier SA may perform a sensing operation by selecting two of three data paths $U_1$, $U_2$, and $U_3$ connected to the three normal cell arrays NCA1, NCA2, and NCA3 and the two reference cell arrays RCA1 and RCA2. As an example, each of the two reference cell arrays RCA1 and RCA2 may be connected to first and second reference bit lines Ref_BL1 and Ref_BL2 or a reference bit line Ref_BL.

As illustrated in FIG. 7, one of the reference cell arrays RCA1 and RCA2 may be arranged between two normal cell arrays of the normal cell arrays NCA1, NCA2, and NCA3.

Figure 8:
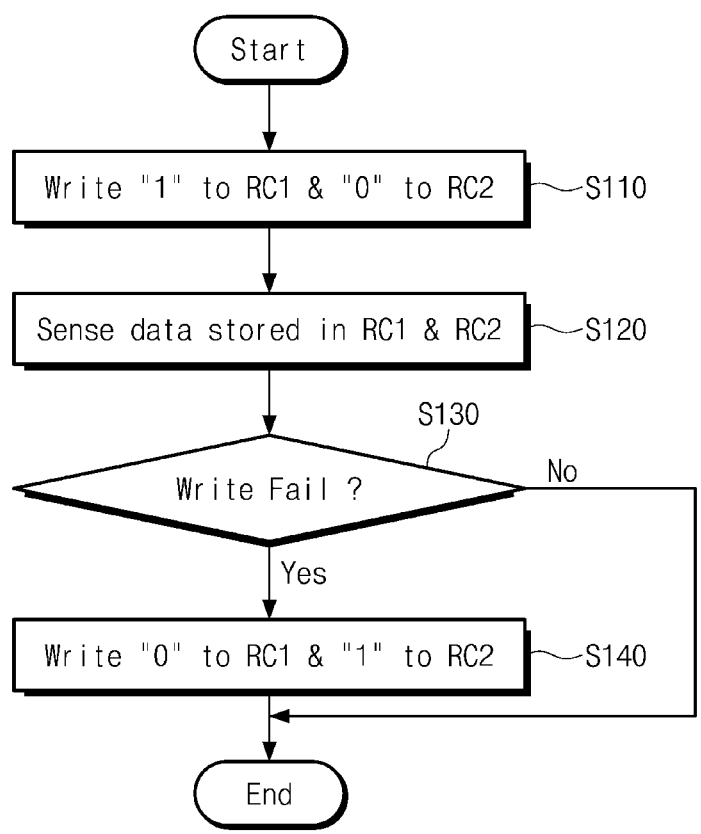
FIG. 8 is a flowchart illustrating a reference cell setting method of a nonvolatile memory device, according to example embodiments.

FIG. 8 is a flowchart illustrating a reference cell setting method of a nonvolatile memory device, according to example embodiments. A reference cell setting method of a nonvolatile memory device will be described with reference to FIGS. 1 to 8.

A first write operation (i.e., the first reference cell setting operation) may be performed such that data "1" is written in the first reference cell RC1 connected to the word line WL and data "0" is written in the second reference cell RC2 connected to the word line WL (S110).

Afterwards, a sensing operation (or, the checking operation) may be performed on the first reference cell RC1 and the second reference cell RC2 (S120). Whether the write operation is failed may be determined (S130).

When the first write operation is failed (YES), target data of the first and second reference cells RC1 and RC2 may be swapped with each other. For example, a second write operation (i.e., the second reference cell setting operation) may be performed such that data "0" is written in the first reference cell RC1 and data "1" is written in the second reference cell RC2 (S140, the swapping operation). Although not illustrated in FIG. 8, an operation of sensing stored data may be additionally performed after the second write operation. When the first write operation is not failed (NO), the first reference cell setting operation may be completed without the swapping operation.

For example, a memory cell illustrated in FIG. 2 has a structure in which the cell transistor CT is connected to the variable resistance element MTJ. However, embodiments of the inventive concept are not limited thereto. According to an embodiment, a memory cell may be implemented to have a structure in which a transmission gate is connected to a variable resistance element.

FIG. 9 is a drawing illustrating a memory cell MCa, according to other example embodiments. Referring to FIG. 9, the memory cell MCa may include a variable resistance element MTJ and a transmission gate TG.

As illustrated in FIG. 9, a resistance value of the variable resistance element MTJ may be determined according to a bias condition of a bit line BL and a source line SL. Referring to a left section "i" of FIG. 9, if a first write voltage VW_AP is applied to the bit line BL, a ground voltage VSS is applied to the source line SL, and the transmission gate TG is turned on, the variable resistance element MTJ has a first resistance value Rap. Here, the transmission gate TG may be turned on by applying a power supply voltage VDD to a gate terminal of an NMOS transistor thereof and the ground voltage VSS to a gate terminal of a PMOS transistor thereof. For example, the NMOS and PMOS transistors are activated based on a voltage of a corresponding word line WL. Referring to a right section "ii" of FIG. 9, if the ground voltage VSS is applied to the bit line BL, a second write voltage VW_P is applied to the source line SL, and the transmission gate TG is turned on, the variable resistance element MTJ has a second resistance value Rp. In an embodiment, the first write voltage VW_AP may be different from the second write voltage VW_P. In an embodiment, the first write voltage VW_AP may be the same as the second write voltage VW_P.

In example embodiments, the memory cell MCa including a variable resistance element MTJ and a transmission gate TG may be implemented by each of the first and second reference cells RC1 and RC2, and the cell transistor CT of FIG. 5. For example, the reference cell swap function illustrated in FIG. 5 may be applied to the first and second reference cells RC1 and RC2 of the memory cell MCa.

Figure 10:
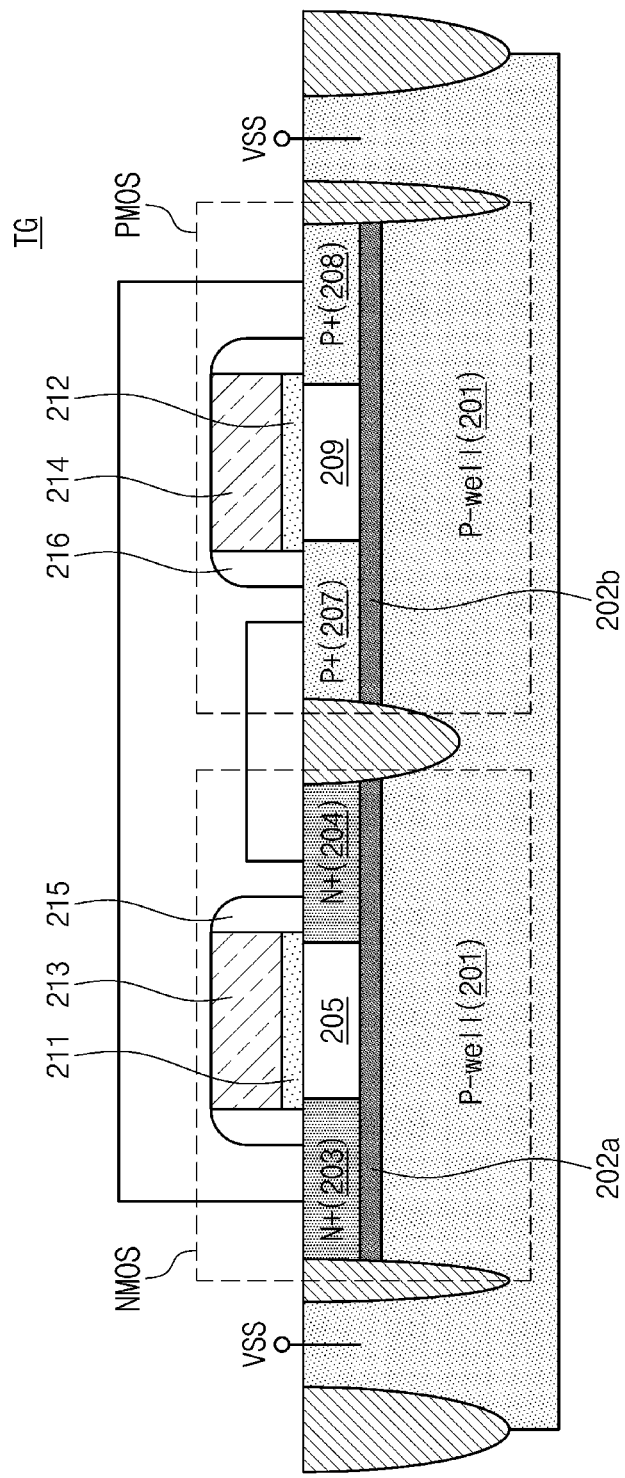
FIG. 10 is a sectional view of a transmission gate in FIG. 9, according to example embodiments.

FIG. 10 is a sectional view of the transmission gate TG in FIG. 9, according to an embodiment of the inventive concept. Referring to FIG. 10, the transmission gate TG may have a common well (P-well) 201 and a common well bias VSS. In another example embodiment, the transmission gate TG may have a common well (N-well) and a common well bias VDD.

A first insulating layer 202a formed on the P-well 201, N+ doped regions (source and drain terminals) 203 and 204 formed on the first insulating layer 202a, and a channel 205 between the N+ doped regions 203 and 204 may constitute an NMOS transistor of the transmission gate TG. An insulation layer 211 may be formed between a gate layer 213 and the channel 205. Spacers 215 may cover lateral sides of the gate layer 213 and the insulation layer 211. In an embodiment, the channel 205 may be a depletion-type channel.

A second insulating layer 202b formed on the P-well 201, P+ doped regions (source and drain terminals) 207 and 208 formed on the second insulating layer 202b, and a channel 209 between the P+ doped regions 207 and 208 may constitute a PMOS transistor of the transmission gate TG. An insulation layer 212 may be formed between a gate layer 214 and the channel 209. Spacers 216 may cover lateral sides of the gate layer 214 and the insulation layer 212. Here, the second insulating layer 202b may be arranged in the same layer as the first insulating layer 202a. As an example, a material of the first insulating layer 202a may be the same as a material of the second insulating layer 202b. As another example, a vertical level of the first insulating layer 202a may be the same as a vertical level of the second insulating layer 202b. In an embodiment, the channel 209 may be a depletion-type channel.

In an embodiment, the N+ region 203 of the NMOS transistor and the P+ region 208 of the PMOS transistor may be electrically connected to each other. Also, the N+ region 204 of the NMOS transistor and the P+ region 207 of the PMOS transistor may be electrically connected to each other. For example, source and drain terminals of the NMOS transistor and source and drain terminals of the PMOS transistor may be electrically connected together.

In an embodiment, the NMOS and PMOS transistors may be depletion-type transistors. For example, the transmission gate TG may be implemented by a fully depleted silicon on insulator (FDSOI) process. Here, the FDSOI refers a technology for forming a transistor electrode on a structure in which an ultra-thin insulation oxide is formed on a silicon wafer.

Figure 11:
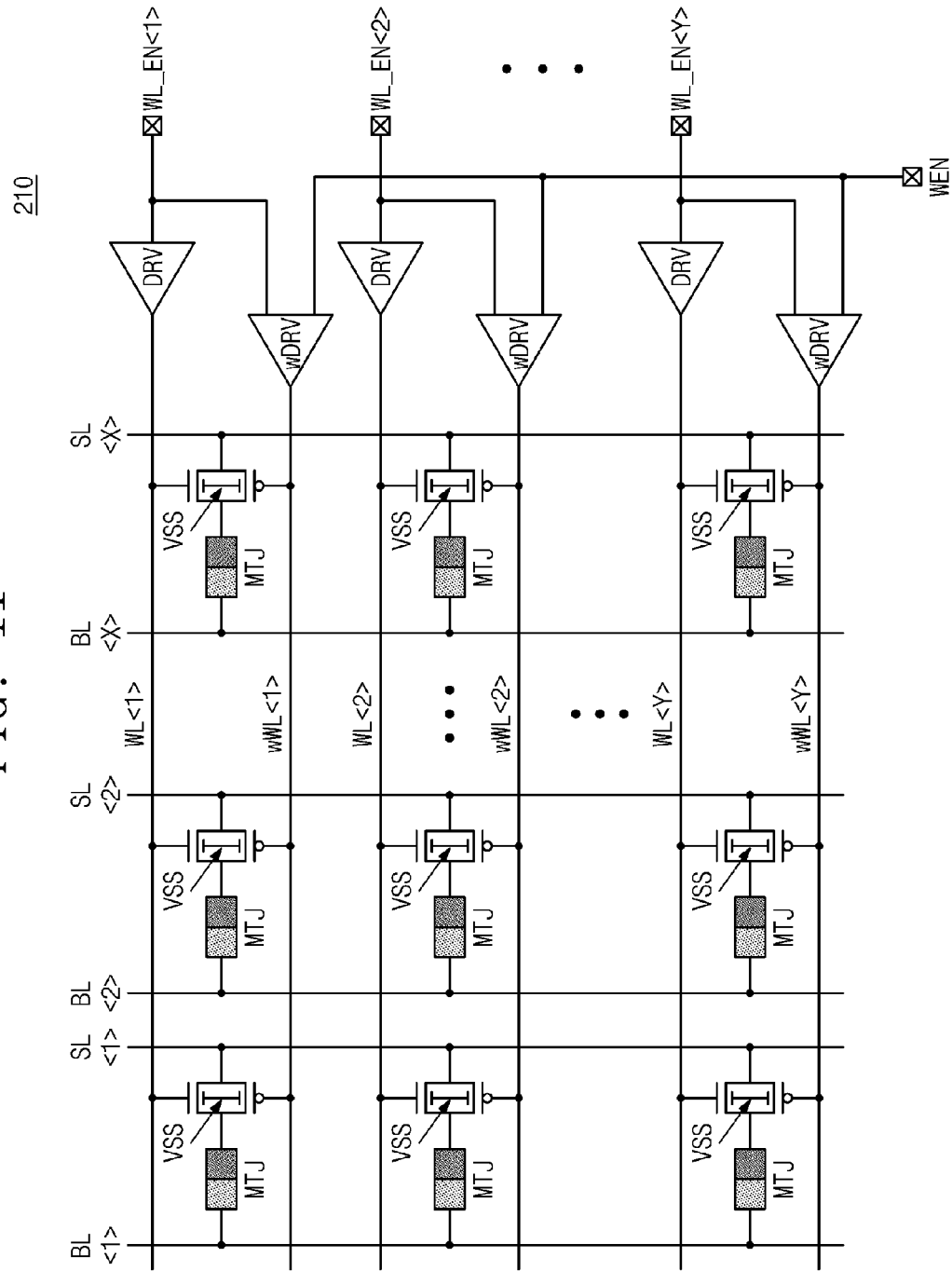
FIG. 11 is a drawing illustrating a memory cell array, according to example embodiments.

FIG. 11 is a drawing illustrating a memory cell array 210, according to example embodiments. Referring to FIG. 11, the memory cell array 210 may include word line drivers DRV, and word line drivers wDRV for writing to drive transmission gates.

In an embodiment, the word line drivers DRV may be activated in response to the corresponding word line enable signals WL_EN<1>, WL_EN<2>, . . . , and WL_EN<Y>, respectively. Here, Y may be a natural number greater than 1. For example, a first word line driver DRV may activate (e.g., "H") when the first word line enable signal WL_EN<1> is activated (e.g., "H").

In an embodiment, the word line drivers wDRV for writing may be respectively activated in response to the corresponding word line enable signals WL_EN<1>, WL_EN<2>, . . . , and WL_EN<Y> and a write enable signal WEN. For example, the word line drivers wDRV for writing may be activated only in a write operation. For example, a first write word line driver wDRV may activate when the first word line enable signal WL_EN<1> and the write enable signal WEN are activated.

In an embodiment, the corresponding transmission gates may be connected between the word lines WL<1>, WL<2>, . . . , and WL<Y> and write word lines wWL<1>, wWL<2>, . . . , and wWL<Y>.

In an embodiment, bit lines BL<1> to BL<X> that are respectively connected to a first set of transmission gates connected to the first word line WL<1> may be the same as bit lines BL<1> to BL<X> that are respectively connected to a second set of transmission gates connected to the second word line WL<2>. Here, X may be a natural number greater than 1.

In an embodiment, source lines SL<1> to SL<X> that are respectively connected to the first set of transmission gates may be the same as source lines SL<1> to SL<X> that are respectively connected to the second set of transmission gates.

In each transmission gate, a gate terminal of an NMOS transistor may be connected to the corresponding word line driver DRV, and a gate terminal of a PMOS transistor may be connected to the corresponding word line driver wDRV for writing. For example, in each transmission gate, the gate terminal of the PMOS transistor may be connected to a write word line to which an output of the corresponding word line driver wDRV for writing is provided.

In example embodiments, in a read operation, an NMOS transistor of the corresponding transmission gate TG may be turned on, and in a write operation, an NMOS transistor and a PMOS transistor of the corresponding transmission gate TG may be turned on.

In an embodiment, the ground voltage VSS may be applied to a well of a transmission gate.

Figure 12:
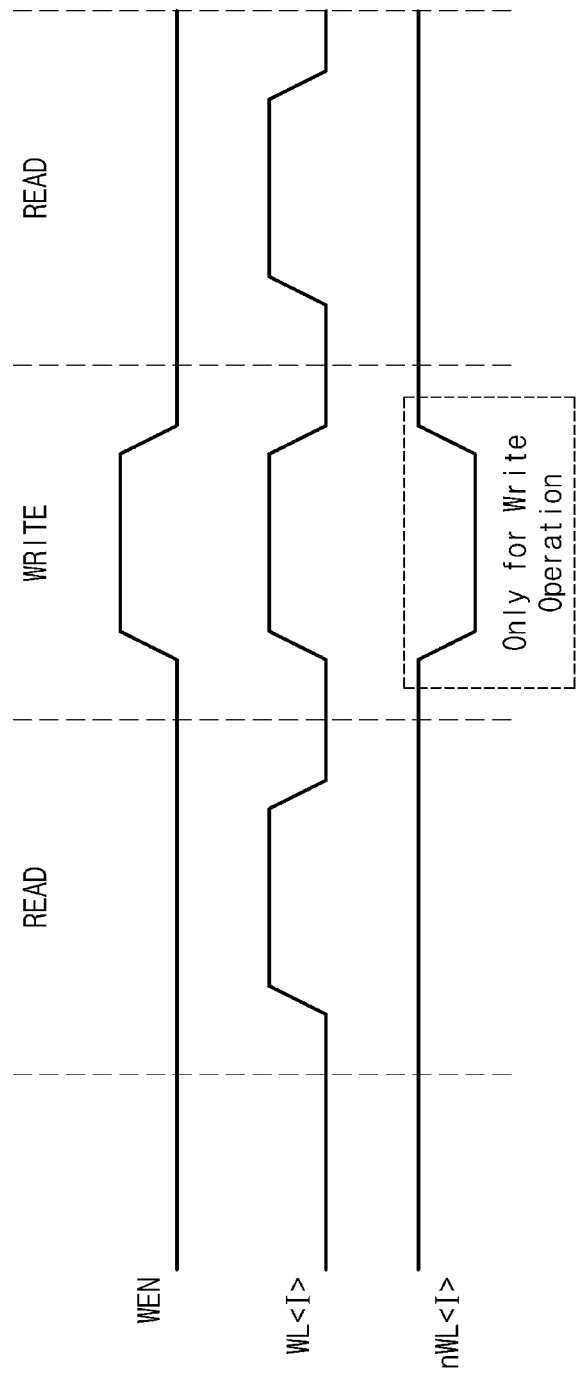
FIG. 12 is a drawing illustrating an operating timing of a memory cell array illustrated in FIG. 11.

FIG. 12 is a drawing illustrating an operating timing of the memory cell array 210 illustrated in FIG. 11. During a write operation, a write enable signal WEN has a high level, a selected word line (e.g., WL<I>) has the high level, and a selected write word line (e.g., wWL<I>) connected to the selected word line driver wDRV for writing has a low level. For example, in each transmission gate TG, an NMOS transistor and a PMOS transistor may be turned on during the write operation. Here, I may be a natural number greater than 1.

During a read operation, a selected word line (e.g., WL<I>) has the high level, and a selected write word line (e.g., wWL<I>) connected to the selected word line driver wDRV for writing has the high level. For example, in each transmission gate TG, an NMOS transistor may be turned on and a PMOS transistor may be turned off during the read operation.

Figure 13:
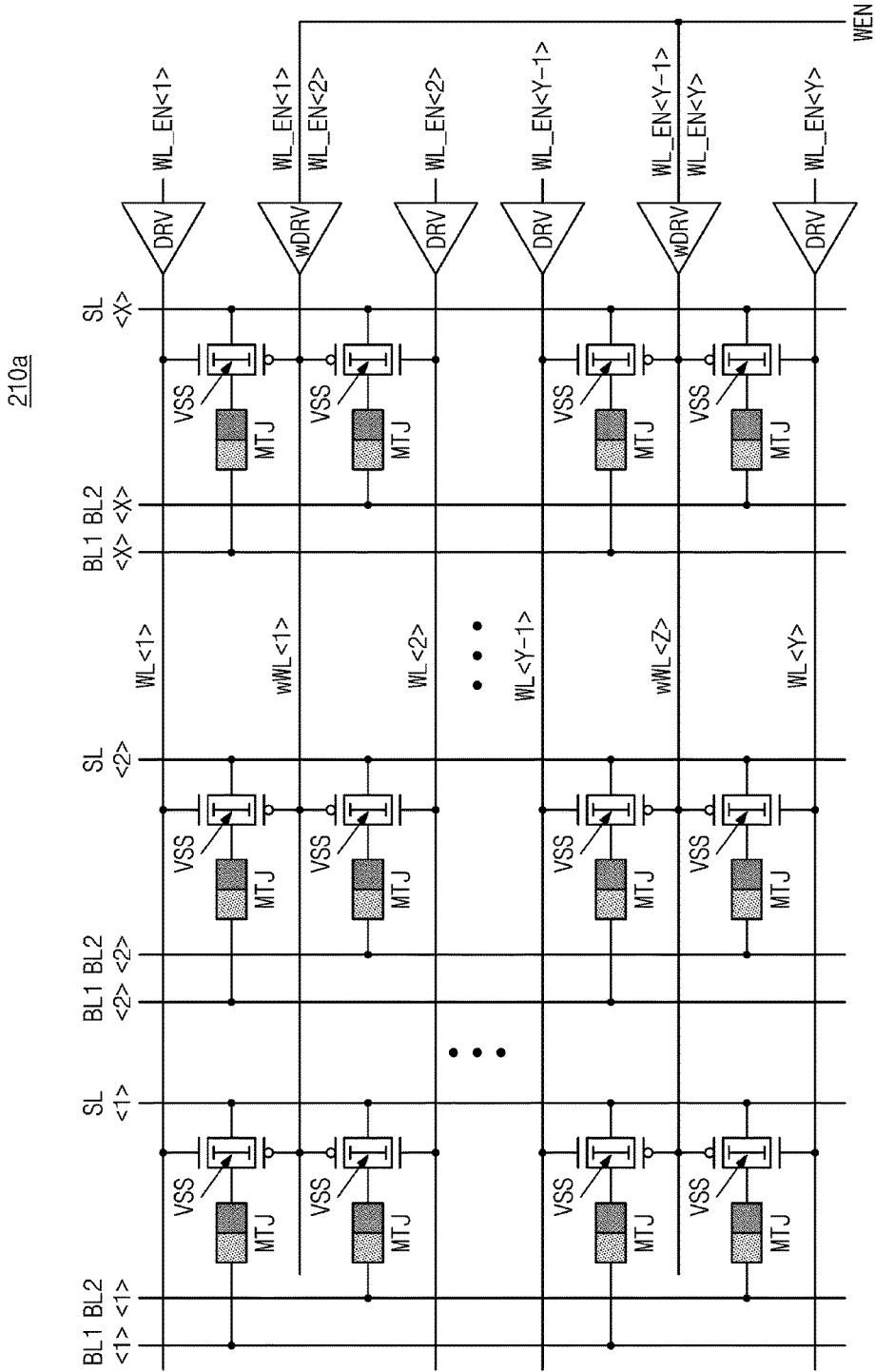
FIG. 13 is a drawing illustrating a memory cell array, according to other example embodiments.

FIG. 13 is a drawing illustrating a memory cell array 210a, according to other example embodiments. Referring to FIG. 13, the memory cell array 210a may include transmission gates (or transmission gate cells) that share a word line connected to the word line driver wDRV for writing.

In an embodiment, a first set of transmission gates connected to a first word line WL<1> of word lines and a second set of transmission gates connected to a second word line WL<2> thereof may share a first write word line wWL<1>. For example, a first word line driver wDRV may activate when at least one of the first and second word line enable signals WL_EN<1> and WL_EN<2> is activated and the write enable signal WEN is activated.

In an embodiment, a first set of bit lines BL1<1> to BL1<X> that respectively correspond to the first set of transmission gates may be different from a second set of bit lines BL2<1> to BL2<X> that respectively correspond to the second set of transmission gates. For example, a first bit line BL1<1> may be connected to odd numbered transmission gates (i.e., 1, 3, 5, . . . , etc.) through corresponding MTJs, and a second bit line BL2<1> may be connected to even numbered transmission gates (i.e., 2, 4, 6, . . . , etc.) through corresponding MTJs.

In an embodiment, source lines SL<1> to SL<X> that respectively correspond to the first set of transmission gates may be the same as source lines SL<1> to SL<X> that respectively correspond to the second set of transmission gates.

For example, the memory cell array 210a illustrated in FIG. 13 includes the first and second sets of transmission gates that share a write word line connected to the word line driver wDRV for writing and are connected to shared source lines. However, embodiments of the inventive concept may not be limited thereto. The first and second sets of transmission gates may be implemented to be connected to separate source lines.

Figure 14:
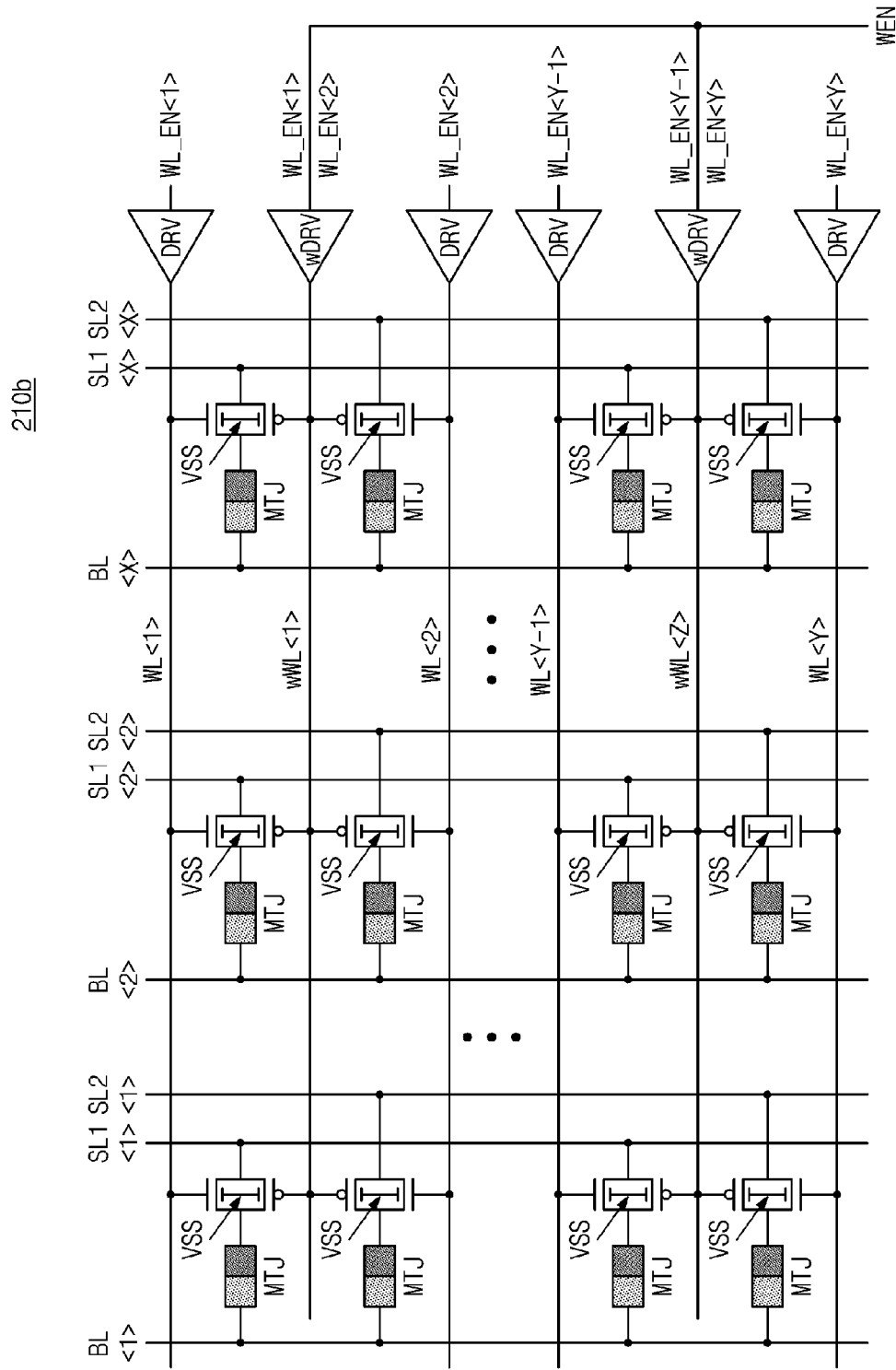
FIG. 14 is a drawing illustrating a memory cell array, according to other example embodiments.

FIG. 14 is a drawing illustrating a memory cell array 210b, according to other example embodiments. Referring to FIG. 14, the memory cell array 210b may include transmission gates (or transmission gate cells) that share a word line connected to the write word line driver wDRV for writing and are connected to separated source lines.

In an embodiment, bit lines BL<1> to BL<X> that respectively correspond to the first set of transmission gates may be the same as bit lines BL<1> to BL<X> that respectively correspond to the second set of transmission gates.

In an embodiment, a first set of source lines SL1<1> to SL1<X> that respectively correspond to the first set of transmission gates may be different from a second set of source lines SL2<1> to SL2<X> that respectively correspond to the second set of transmission gates. For example, a first source line SL1<1> may be connected to odd numbered transmission gates (i.e., 1, 3, 5, . . . , etc.), and a second source line SL2<1> may be connected to even numbered transmission gates (i.e., 2, 4, 6, . . . , etc.).

Figure 15:
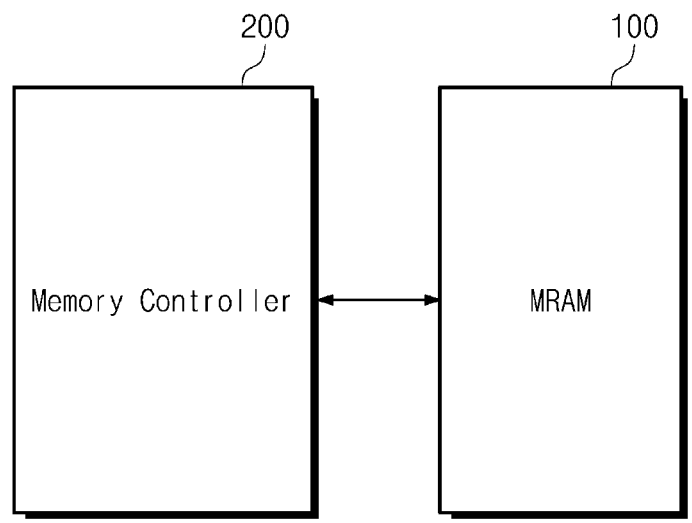
FIG. 15 is a view illustrating a storage device according to example embodiments.

FIG. 15 is a drawing illustrating a storage device, according to example embodiments. Referring to FIG. 15, a storage device 10 may include at least one nonvolatile memory device (e.g., MRAM) 100 and a memory controller 200 that controls the nonvolatile memory device 100. The nonvolatile memory device MRAM includes a plurality of MRAMs.

The nonvolatile memory 100 may be implemented with the same configuration or method as described with reference to FIGS. 1 to 14. In an embodiment, the nonvolatile memory device 100 may communicate with the memory controller 200 through a double data rate (DDR) interface.

Figure 16:
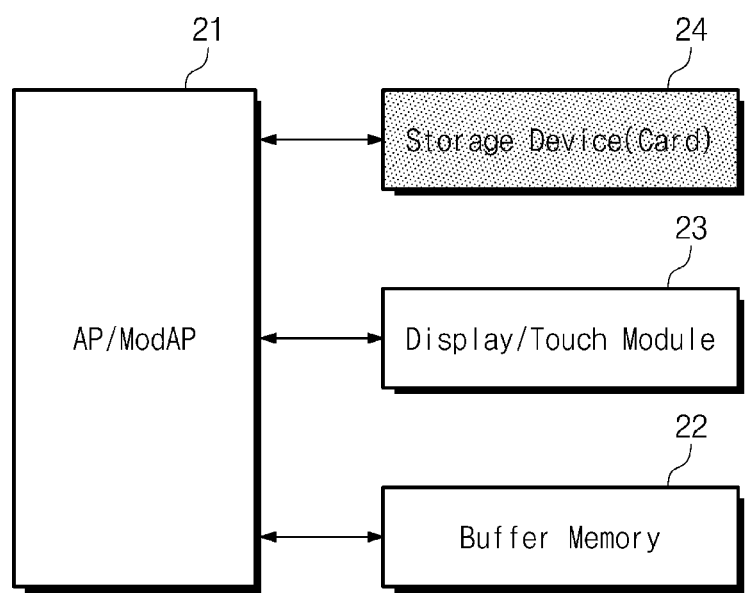
FIG. 16 is a drawing illustrating a mobile device, according to example embodiments.

FIG. 16 is a drawing illustrating a mobile device 20, according to example embodiments. Referring to FIG. 16, the mobile device 20 may include a processor (AP/ModAP) 21, a buffer memory 22, a display/touch module 23, and a storage device 24.

The processor 21 may be implemented to control overall operations of the mobile device 20 and wired/wireless communication with an external device. For example, the processor 21 may be an application processor (AP), an integrated modem application processor (ModAP), etc.

The processor 21 may include authentication agent, trusted execution environment (TEE), and a secure chip. The secure chip may be implemented with software and/or tamper resistant hardware, may provide high-level security, and may operate in conjunction with trusted execution environment (TEE) of the processor 21. For example, the secure chip may perform an encryption and decryption operation, MAC key generation/verification, etc. in the TEE. The secure chip may include a Native operating system (OS), a secure storage device that is internal data storage, an access control block that controls authority to access the secure chip, a secure function block that performs ownership management, key management, digital signature, encryption/decryption, etc., and a firmware update block that updates firmware of the secure chip. For example, the secure chip may be a universal IC card (UICC) (e.g., USIM, CSIM, and ISIM), a subscriber identity module (SIM) card, an embedded secure elements (eSE), a MicroSD, Stickers, and the like.

The buffer memory 22 may be implemented to temporarily store data needed for a processing operation of the mobile device 20. In an embodiment, the buffer memory 22 may be implemented with a DRAM, an SRAM, an MRAM, etc. The buffer memory 22 may include a non-encryption data area and an encryption data area. Here, the encryption data area may store data that are encrypted by the secure chip.

The display/touch module 23 may be implemented to display data processed by the processor 21 or to receive data from a touch panel.

The storage device 24 may be implemented to store data of a user. The storage device 24 may be an embedded multimedia card (eMMC), a solid state drive (SSD), a universal flash storage (UFS), etc. The storage device 24 may include a nonvolatile memory device described with reference to FIGS. 1 to 15.

The storage device 24 may include at least one nonvolatile memory device. The nonvolatile memory device may be a NAND flash memory, a vertical NAND flash memory (VNAND), a NOR flash memory, a resistive random access memory (RRAM), a phase change memory (PRAM), a magneto-resistive random access memory (MRAM), a ferroelectric random access memory (FRAM), a spin transfer torque random access memory (STT-RAM), or the like.

Furthermore, the nonvolatile memory may be implemented to have a three-dimensional (3D) array structure. In an embodiment of the inventive concept, a three dimensional 3D memory array is provided. The 3D memory array is monolithically formed in one or more physical levels of arrays of memory cells having an active area disposed above a silicon substrate and circuitry associated with the operation of those memory cells, whether such associated circuitry is above or within such substrate. Such associated circuitry is above or within such substrate. The term "monolithic" means that layers of each level of the array are directly deposited on the layers of each underlying level of the array.

In an embodiment of the inventive concept, the 3D memory array includes vertical NAND strings that are vertically oriented such that at least one memory cell is located over another memory cell. The at least one memory cell may comprise a charge trap layer. Each vertical NAND string may include at least one selection transistor located over memory cells. At least one selection transistor may have the same structure as those of memory cells and may be monolithically formed together with memory cells.

The three-dimensional memory array is formed of a plurality of levels and has word lines or bit lines shared among levels. The following patent documents, which are hereby incorporated by reference, describe suitable configurations for three-dimensional memory arrays, in which the three-dimensional memory array is configured as a plurality of levels, which is applied by Samsung Electronics Co., with word lines and/or bit lines shared between levels: U.S. Pat. Nos. 7,679,133; 8,553,466; 8,654,587; 8,559,235; and US Pat. Pub. No. 2011/0233648. The nonvolatile memory according to an exemplary embodiment of the inventive concept may be applicable to a charge trap flash (CTF) in which an insulating layer is used as a charge storage layer, as well as a flash memory device in which a conductive floating gate is used as a charge storage layer.

According to example embodiments, the mobile device 20 may improve the overall performance by reducing a chip size or improving the reliability of read performance.

Figure 17:
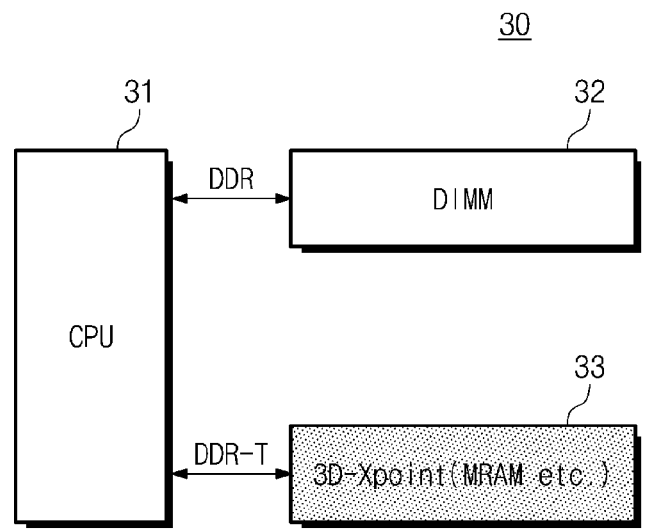
FIG. 17 is a drawing illustrating a computing system, according to example embodiments.

FIG. 17 is a drawing illustrating a computing system 30, according to example embodiments. Referring to FIG. 17, the computing system 30 may include a central processing unit (or processor) 31, a memory module (DIMM) 32, and a nonvolatile memory (NVM) 33.

The nonvolatile memory 33 may input and output data based on the DDR-T interface. In this case, the memory module 32 may be implemented to perform a cache function of the nonvolatile memory 33. In an embodiment, the nonvolatile memory 33 may be a 3D-Xpoint memory. The nonvolatile memory 33 may be implemented with a nonvolatile memory device described with reference to FIGS. 1 to 15.

Figure 18:
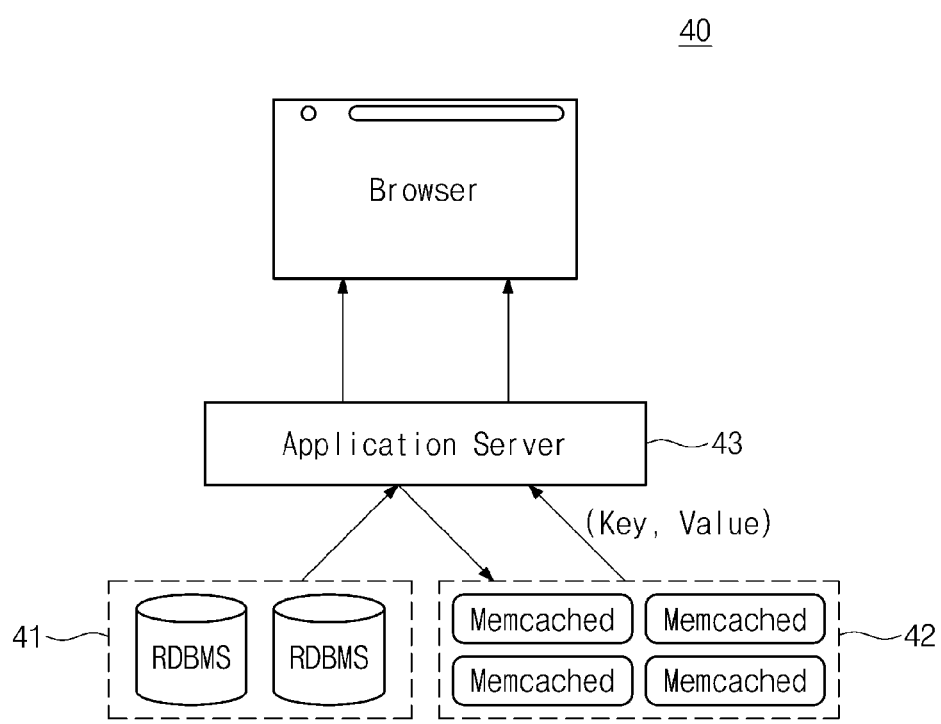
FIG. 18 is a block diagram illustrating a data server system according to other example embodiments.

FIG. 18 is a block diagram illustrating a data server system 40, according to example embodiments. Referring to FIG. 18, the data server system 40 may include a relational database management system (RDBMS) 41, a cache server 42, and an application server 43.

The cache server 42 may be implemented to maintain and delete different key and value pairs in response to an invalidation notification from the related database management system 41. At least one of the relational database management system 41, the cache server 42, and the application server 43 may be implemented with a nonvolatile memory device described with reference to FIGS. 1 to 15.

According to example embodiments, a nonvolatile memory device may swap target data based on reference cell characteristics upon setting reference cells, thereby improving read reliability.

Also, according to example embodiments, the nonvolatile memory device may include a memory cell having a transmission gate formed by using fully depleted silicon on insulator (FDSOI) process, thereby reducing a chip size markedly.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. An operating method of a nonvolatile memory device, the method comprising:
   first storing a first data in a first reference cell and a second data opposite to the first data in a second reference cell, the first reference cell connected to a word line and a first reference bit line and the second reference cell connected to the word line and a second reference bitline;
   comparing a voltage of the first reference bit line with a voltage of the second reference bit line to determine whether at least one of the first and second data is abnormally stored in the first and second reference cells after the first storing is performed; and
   when it is determined that at least one of the first and second data is abnormally stored in the first and second reference cells, second storing the second data in the first reference cell and the first data in the second reference cell.

2. The method of claim 1, wherein each of the first and second reference cells is a magnetic random access memory (MRAM) cell.

3. The method of claim 2, wherein the MRAM cell includes a magnetic tunnel junction element connected to either an n-channel metal oxide semiconductor (NMOS) transistor or a transmission gate having an NMOS transistor and a p-channel metal oxide semiconductor (PMOS) transistor connected to each other.

4. The method of claim 1, wherein the first storing is performed in response to a write enable signal.

5. The method of claim 1, further comprising:
   storing data in a memory cell connected to the word line; and
   performing a normal read operation for the memory cell.

6. The method of claim 5, wherein performing the normal read operation comprises:
   connecting the first reference bit line and the second reference bit line; and
   comparing a voltage of the connected first and second reference bit lines with a voltage of a bit line connected to the memory cell.

7. An operating method of a nonvolatile memory device including a memory cell array, the method comprising:
   first storing a first data bit in a first reference cell of the memory cell array and a second data bit having a logic value opposite to the first data bit in a second reference cell of the memory cell array, the first reference cell connected to a word line and a first reference bit line, and the second reference cell connected to the word line and a second reference bit line;
   comparing a voltage of the first reference bit line with a voltage of the second reference bit line to determine whether at least one of the first and second data bits is abnormally stored in the first and second reference cells; and
   when it is determined that at least one of the first and second data bits is abnormally stored in the first and second reference cells, second storing the second data bit in the first reference cell and the first data bit in the second reference cell,
   wherein the first storing comprises:
      applying a first voltage corresponding to the first data bit to a data line by a first write driver and electrically connecting the data line to the first reference bit line by a first selection circuit; and
      applying a second voltage corresponding to the second data bit to a reference data line by a second write driver and electrically connecting the reference data line to the second reference bit line by a second selection circuit, and
   wherein the second storing comprises:
      applying the second voltage to the data line by the first write driver and electrically connecting the data line to the first reference bit line by the first selection circuit; and
      applying the first voltage to the reference data line by the second write driver and electrically connecting the reference data line to the second reference bit line by the second selection circuit.

8. The method of claim 7, wherein each of the first and second reference cells is a magnetic random access memory (MRAM) cell.

9. The method of claim 8, wherein the first storing comprises storing data "1" in the first reference cell and data "0" in the second reference cell, respectively, and
   wherein the second storing comprises storing data "0" in the first reference cell and data "1" in the second reference cell, respectively.

10. The method of claim 7, further comprising:
    performing a normal read operation of a memory cell of the memory cell array,
    wherein a data path for the first storing and the second storing is different from a data path for the normal read operation.

11. The method of claim 7, further comprising:
    storing data bit in a memory cell connected to the word line; and
    performing a normal read operation for the memory cell, wherein performing the normal read operation comprises:
    connecting the first reference bit line and the second reference bit line; and
    comparing a voltage of the connected first and second reference bit lines with a voltage of a bit line connected to the memory cell.

12. A nonvolatile memory device comprising:
    a first memory cell connected to a first bit line;
    a first reference cell connected to a first reference bit line;
    a second reference cell connected to a second reference bit line;
    a sense amplifier configured to compare a voltage of the first bit line with a reference voltage, wherein the reference voltage is a voltage of a node at which the first reference bit line and the second reference bit line are connected to each other,
    wherein, during a reference cell setting operation, the nonvolatile memory device is configured to write a first data and a second data having an opposite logic value to the first data in the first reference cell and the second reference cell, respectively, compare a voltage of the first reference bit line with a voltage of the second reference bit line to determine at least one of the first and second data is abnormally written in the first reference cell and second reference cell, and when it is determined that at least one of the first data and the second data is abnormally written in the first reference cell and the second reference cell, the nonvolatile memory device is configured to write the second data and the first data in the first reference cell and the second reference cell, respectively.

13. The nonvolatile memory device of claim 12, wherein each of the first memory cell and the first and second reference cells comprises:

a variable resistance element having one end of which is connected to a corresponding bit line; and a selection transistor connected to the other end of the variable resistance element and a corresponding source line.

14. The nonvolatile memory device of claim 13, wherein source lines connected to the first memory cell and the first and second reference cells are connected to each other.

15. The nonvolatile memory device of claim 12, further comprising:

a first selection circuit configured to connect a data line to the first reference bit line in response to a reference cell channel signal;

a second selection circuit configured to connect a reference data line to the second reference bit line in response to the reference cell channel signal;

a first write driver configured to apply a voltage corresponding to data to the data line in response to a write enable signal; and a second write driver configured to apply a voltage corresponding to an inverted version of the data to the reference data line in response to the write enable signal.

16. The nonvolatile memory device of claim 15, wherein the write enable signal is generated by performing an OR operation on a first write enable signal and an output signal, wherein the output signal is generated by performing an AND operation on a second write enable signal and a reference write enable signal, and wherein the reference write enable signal is generated by performing an AND operation on an output value of the sense amplifier and the reference cell channel signal.

17. The nonvolatile memory device of claim 16, wherein the sense amplifier compares a voltage of the data line with a voltage of the reference data line in response to a read enable signal.

18. The nonvolatile memory device of claim 15, during a normal read operation, the first selection circuit is configured to connect the data line to the first bit line, and the second selection circuit is configured to connect the reference data line to the node.

* * * * *